US009951272B2

(12) United States Patent
Kamplain

(10) Patent No.: US 9,951,272 B2
(45) Date of Patent: Apr. 24, 2018

(54) METHOD OF MAKING SEMICONDUCTOR NANOCRYSTALS

(71) Applicant: SAMSUNG RESEARCH AMERICA, INC., Mountain View, CA (US)

(72) Inventor: Justin W. Kamplain, Bartlesville, OK (US)

(73) Assignee: SAMSUNG RESEARCH AMERICA, INC., Mountain View, CA (US)

(*) Notice: Subject to any disclaimer, the term of this patent is extended or adjusted under 35 U.S.C. 154(b) by 280 days.

(21) Appl. No.: 14/182,101

(22) Filed: Feb. 17, 2014

(65) Prior Publication Data
US 2014/0312286 A1 Oct. 23, 2014

Related U.S. Application Data

(60) Provisional application No. 61/814,024, filed on Apr. 19, 2013.

(51) Int. Cl.
| | |
|---|---|
| *H01L 33/16* | (2010.01) |
| *C09K 11/08* | (2006.01) |
| *H01L 33/30* | (2010.01) |
| *C09K 11/63* | (2006.01) |
| *C09K 11/70* | (2006.01) |
| *C01B 17/20* | (2006.01) |
| *C01B 19/00* | (2006.01) |
| *C01B 25/08* | (2006.01) |
| *H01L 33/00* | (2010.01) |
| *H01L 33/26* | (2010.01) |

(52) U.S. Cl.
CPC .......... *C09K 11/08* (2013.01); *C01B 17/20* (2013.01); *C01B 19/002* (2013.01); *C01B 19/007* (2013.01); *C01B 25/082* (2013.01); *C09K 11/0805* (2013.01); *C09K 11/63* (2013.01); *C09K 11/70* (2013.01); *H01L 33/16* (2013.01); *C01P 2002/84* (2013.01); *C01P 2004/52* (2013.01); *C01P 2004/64* (2013.01); *C01P 2004/80* (2013.01); *C01P 2004/86* (2013.01); *C01P 2006/40* (2013.01); *H01L 33/005* (2013.01); *H01L 33/26* (2013.01); *H01L 33/30* (2013.01)

(58) Field of Classification Search
None
See application file for complete search history.

(56) References Cited

U.S. PATENT DOCUMENTS

| | | | |
|---|---|---|---|
| 6,106,609 A | 8/2000 | Yang et al. | |
| 6,322,901 B1 | 11/2001 | Bawendi et al. | |
| 7,557,028 B1* | 7/2009 | Scher et al. | 438/604 |
| 8,354,785 B2 | 1/2013 | Clough et al. | |
| 8,845,927 B2 | 9/2014 | Breen et al. | |
| 9,136,428 B2 | 9/2015 | Clough et al. | |
| 9,139,435 B2 | 9/2015 | Breen et al. | |
| 2002/0066401 A1 | 6/2002 | Peng et al. | |
| 2003/0066998 A1* | 4/2003 | Lee | B82Y 10/00 257/19 |
| 2003/0097976 A1 | 5/2003 | Zehnder et al. | |
| 2003/0173541 A1 | 9/2003 | Peng et al. | |
| 2003/0209105 A1 | 11/2003 | Bawendi et al. | |
| 2003/0227116 A1* | 12/2003 | Halik | H01L 29/12 267/202 |
| 2005/0129947 A1 | 6/2005 | Peng et al. | |
| 2006/0003183 A1 | 1/2006 | Helber et al. | |
| 2006/0040103 A1 | 2/2006 | Whiteford et al. | |
| 2006/0110313 A1 | 5/2006 | Cho et al. | |
| 2006/0130741 A1 | 6/2006 | Peng et al. | |
| 2006/0157720 A1 | 7/2006 | Bawendi et al. | |
| 2006/0202167 A1 | 9/2006 | Landry et al. | |
| 2007/0049765 A1 | 3/2007 | Lucey et al. | |
| 2007/0221121 A1 | 9/2007 | Zehnder et al. | |
| 2007/0289491 A1 | 12/2007 | Peng et al. | |
| 2008/0099728 A1 | 5/2008 | Jin et al. | |
| 2008/0118755 A1* | 5/2008 | Whiteford | C07F 5/025 428/403 |
| 2008/0160306 A1 | 7/2008 | Mushtaq et al. | |
| 2008/0202383 A1 | 8/2008 | Shi | |
| 2008/0220593 A1 | 9/2008 | Pickett et al. | |
| 2008/0230849 A1 | 9/2008 | Afzali-Ardakani et al. | |
| 2008/0247932 A1 | 10/2008 | Li et al. | |
| 2009/0073349 A1 | 3/2009 | Park et al. | |
| 2010/0001256 A1 | 1/2010 | Coe-Sullivan et al. | |
| 2010/0052512 A1* | 3/2010 | Clough et al. | 313/498 |

(Continued)

FOREIGN PATENT DOCUMENTS

| | | | |
|---|---|---|---|
| WO | WO2008133660 A2 | 11/2008 | |
| WO | WO2009035657 A1 | 3/2009 | |
| WO | WO2009097319 A2 | 8/2009 | |
| WO | WO 2012092178 A1 * | 7/2012 | B82Y 30/00 |
| WO | WO2012158832 A2 | 11/2012 | |

OTHER PUBLICATIONS

Dabbousi, et al., "(CdSe) ZnS Core-Shell Quantum Dots: Synthesis and Characterizaqtion of a Size Series of Highly Luminescent Nanocrystallites", *J. Phys. Chem.* (1997) vol. 101, pp. 9463-9475.
De Mello et al., "An Improved Experimental Determination of External Photoluminescence Quantum Efficiency", *Adv. Mater.* (1997) vol. 9, (3), pp. 230-232.
Hall, D.G., "Structure, Properties, and Preparation of Boronic Acid Derivatives: Overview of Their Reactions and Applications", *Boronic Acids: Preparation and Applications in Organic Synthesis, Medicine and Materials*, Second Edition (2011), Edited by Dennis G. Hall, Wiley-VCH Verlag GmbH & Co. KGaA, Ch. 1, pp. 1-133.

(Continued)

*Primary Examiner* — Katie L Hammer
(74) *Attorney, Agent, or Firm* — Cantor Colburn LLP

(57) ABSTRACT

A method for preparing semiconductor nanocrystals includes reacting one or more semiconductor nanocrystal precursors in a liquid medium in the presence of a boronic compound at a reaction temperature resulting in semiconductor nanocrystals. Semiconductor nanocrystals are also disclosed.

19 Claims, No Drawings

(56) References Cited

U.S. PATENT DOCUMENTS

| | | | |
|---|---|---|---|
| 2011/0006285 A1* | 1/2011 | Lifshitz | C09K 11/025 257/15 |
| 2011/0155969 A1 | 6/2011 | Bartel et al. | |
| 2011/0226991 A1 | 9/2011 | Treadway et al. | |
| 2011/0306079 A1 | 12/2011 | Tulsky et al. | |
| 2012/0244062 A1 | 9/2012 | Yang et al. | |
| 2013/0069018 A1 | 3/2013 | Zhu et al. | |
| 2013/0273247 A1 | 10/2013 | Kamplain et al. | |
| 2015/0013589 A1 | 1/2015 | Liu et al. | |
| 2015/0014586 A1 | 1/2015 | Liu et al. | |
| 2015/0014629 A1 | 1/2015 | Breen et al. | |
| 2015/0021551 A1 | 1/2015 | Breen et al. | |
| 2015/0152324 A1 | 6/2015 | Breen et al. | |
| 2015/0166341 A1 | 6/2015 | Hamilton et al. | |
| 2016/0068750 A1 | 3/2016 | Clough et al. | |

OTHER PUBLICATIONS

Hollingsworth, et al., "Soft Chemical Synthesis and Manipulation of Semiconductor Nanocrystals", *Semiconductor and Metal Nanocrystals: Synthesis and Electronic and Optical Properties*, Klimov, ed. 2004, Marcel Dekker, pp. 1-64.

Murray, C.B., et al., "Synthesis and Characterization of Monodisperse Nanocrystals and Close-Packed Nanocrystal Assemblies", *Annu. Rev. Mater. Sci.*, 2000, 30: pp. 545-610.

Murray, C., et al., "Synthesis and Characterization of Nearly Monodisperse CdE (E = S, Se, Te) Semiconductor Nanocrystallites" (Nov. 1993), *J. Am. Chem. Soc.*, 115, pp. 8706-8715.

Trikalitis, et al., "Mesostructured cobalt and nickel molybdenum sulfides", *Microporous and Mesoporous Materials* (online), vol. 88, Iss. 1-3, pp. 187-190.

* cited by examiner

METHOD OF MAKING SEMICONDUCTOR NANOCRYSTALS

This application claims priority to U.S. Provisional Patent Application No. 61/814,024, filed on 19 Apr. 2013, which is hereby incorporated herein by reference in its entirety for all purposes.

FEDERALLY SPONSORED RESEARCH OR DEVELOPMENT

This invention was made with Government support under Advanced Technology Program Award No. 70NANB7H7056 awarded by NIST. The United States has certain rights in the invention.

TECHNICAL FIELD OF THE INVENTION

The present invention relates to the field of nanotechnology and more particularly to semiconductor nanocrystals and methods for preparing semiconductor nanocrystals.

BRIEF SUMMARY OF THE INVENTION

The present invention relates to methods for preparing semiconductor nanocrystals and semiconductor nanocrystals prepared thereby.

In accordance with one aspect of the present invention, there is provided a method for preparing semiconductor nanocrystals comprising reacting one or more semiconductor nanocrystal precursors in a liquid medium in the presence of a boronic compound at a reaction temperature resulting in semiconductor nanocrystals.

The method can further comprise including additional amounts of one or more semiconductor nanocrystal precursors with the semiconductor nanocrystals under conditions suitable to increase the size of the semiconductor nanocrystals. Preferably, such additional growth of the semiconductor nanocrystals occurs in the presence of the boronic compound.

In the method described herein, the one or more semiconductor nanocrystal precursors are selected based on the composition of the semiconductor nanocrystals being prepared. For example, semiconductor nanocrystals typically comprise one or more inorganic semiconductor materials. Examples of typical inorganic semiconductor materials that can be included in semiconductor nanocrystals include, but are not limited to, a Group IV element, a Group II-VI compound, a Group II-V compound, a Group III-VI compound, a Group III-V compound, a Group IV-VI compound, a Group I-III-VI compound, a Group II-IV-VI compound, and/or a Group II-IV-V compound, with Group I referring to Group IB (e.g., Cu, Ag, Au) of the Periodic Table, Group II referring to Group IIB (e.g., Zn, Cd, Hg) of the Periodic Table, Group III referring to Group IIIA (e.g., Al, Ga, In, Tl) of the Periodic Table, Group IV (e.g., Si, Ge) of the Periodic Table, Group V referring to Group VA (N, P, As, Sb) of the Periodic Table, Group VI referring to Group VIA (e.g., O, S, Se, Te) of the Periodic Table.

Such inorganic semiconductor materials comprising a compound can also be represented by the formula MX, wherein M represents one or more metals from Group I, Group II, and/or Group III, and X represents one or more Group V elements (also referred to as pnictogens) and/or one or more Group VI elements (also referred to as chalcogens). Semiconductor nanocrystal precursors for making a semiconductor nanocrystal comprising a semiconductor material that can be represented by the formula MX can comprise one or more M donors and one or more X donors that are selected based on the composition of the semiconductor nanocrystal being prepared. In preparing semiconductor nanocrystals that include two or more different metal constituents, a combination of M-donors can be used to provide the two or more different metal constituents for preparing the desired semiconductor nanocrystal. Analogously, in preparing semiconductor nanocrystals that include two or more different X constituents, a combination of X-donors can be used to provide the two or more different X constituents for preparing the desired semiconductor nanocrystal. Alternatively, a single semiconductor nanocrystal precursor including the desired M and X constituents can be used. A semiconductor nanocrystal comprising, for example, a Group IV element can also be prepared from a single semiconductor nanocrystal precursor.

According to certain aspects, an X donor and M donor are reacted in a liquid medium in the presence of a boronic compound at a reaction temperature to form semiconductor nanocrystals.

The manner in which the semiconductor X donor, the M donor, and the boronic compound are combined can vary. For example, an X donor can be added to a mixture of an M-donor, the boronic compound, and the liquid medium; an M donor can be added to a mixture of an X-donor, the boronic compound, and the liquid medium; an M donor, an X donor can be separately added to a mixture of the boronic compound and the liquid medium; an M donor, an X donor, and the boronic compound can be separately added to the liquid medium; an M-donor and a mixture of an X donor and the boronic compound can be separately added to the liquid medium; an X-donor and a mixture of an M donor and the boronic compound can be separately added to the liquid medium. In the above examples, separate additions may be carried out simultaneously, sequentially, or in an alternating manner. Additions may also be made in other various manners. For example, additions may be made as a single addition or as a series of periodic additions. Other variations may also be determined to be desirable by the skilled artisan.

According to one aspect, the reaction can be terminated or quenched so as to stop growth of the semiconductor nanocrystals before the semiconductor nanocrystals ripen or broaden or combine together. For example, the reaction can be terminated or quenched by cooling the reaction mixture to a quenching temperature effective to terminate or quench the reaction process.

Semiconductor nanocrystals can be isolated or recovered from the reaction mixture before further processing (e.g., before the addition of additional precursor(s) to increase the size of the semiconductor nanocrystals or before growth of an overcoating layer or shell on at least a portion of the outer surface of the semiconductor nanocrystals).

As mentioned above, the semiconductor nanocrytals present in the reaction mixture or after isolation or recovery may be subjected to further growth by exposure to additional amounts of one or more semiconductor nanocrystal precursors. For example, the semiconductor nanocrystals can be exposed to an M donor and an X donor under suitable reaction conditions such that the semiconductor nanocrystals grow in size using the M donor and X donor. Additional amounts of M donor and X donor are provided to the reaction vessel to continue growth of the semiconductor nanocrystals until a desired semiconductor nanocrystal size is reached. The reaction can then be terminated or quenched.

The method described herein can further include growing a coating comprising one or more semiconductor materials over at least a portion of an outer surface of at least a portion of the semiconductor nanocrystals. A coating can further comprise one or more layers, each of which can be the same as, or different from, another layer in the coating.

The semiconductor nanocrystals can be coated in situ in the reaction mixture without prior isolation. Alternatively, the semiconductor nanocrystals can be isolated from the reaction mixture prior to growing a coating over at least a portion of an outer surface of at least a portion of the semiconductor nanocrystals.

The overcoating step can be carried out in the presence of a boronic compound.

The overcoating can include one or more semiconductor materials having a composition different from the composition of the core and can have a band gap greater than the band gap of the core. The overcoat of a semiconductor material on a surface of the nanocrystal can include a Group II-VI compounds, Group II-V compounds, Group III-VI compounds, Group III-V compounds, Group IV-VI compounds, Group compounds, Group II-IV-VI compounds, and Group II-IV-V compounds.

As used herein, "boronic compound" refers to and includes boric acid, boronic acids (that can be represented by the formula: R—B(OH)$_2$, wherein R is a substituted or unsubstituted aliphatic group (e.g., alkyl) or aromatic group (e.g., aryl), which groups can further include one or more heteroatoms), borate esters (also referred to as boronic esters) (that can be represented by the formula RB(OR')$_2$, wherein R and R' are independently a substituted or unsubstituted aliphatic group or aromatic group, which groups can further include one or more heteroatoms, and wherein R and R' can be the same or different), bonnie acids (that can be represented by the formula RR'B(OH) wherein R and R' are independently a substituted or unsubstituted aliphatic group or aromatic group, which groups can further include one or more heteroatoms, and wherein R and R' can be the same or different), chemical derivatives of any of the foregoing, and chemical equivalents of any of the foregoing. Examples of an R or R' aromatic group include, but are not limited to, phenyl, benzyl, naphthyl, tolyl, anthracyl, nitrophenyl, or halophenyl groups. Examples heteroaryl groups, but are not limited to, aryl groups with one or more heteroatoms in the ring, for instance furyl, pyridyl, pyrrolyl, phenanthryl. Examples of aliphatic groups that can be included in include, but are not limited to, a straight or branched $C_{1-18}$ hydrocarbon chains, that can include at least one double bond, at least one triple bond, or at least one double bond and one triple bond and/or can be interrupted by —O—, —S—, —N($R_a$)—, —N($R_a$)—C(O)—O—, —O—C(O)—N($R_a$)—, —N($R_a$)—C(O)—N($R_b$)—, —O—C(O)—O—, —P($R_a$)—, or —P(O)($R_a$)—, wherein each of $R_a$ and $R_b$ independently, is hydrogen, alkyl, alkenyl, alkynyl, alkoxy, hydroxylalkyl, hydroxyl, or haloalkyl. In certain embodiments, the aryl group is a substituted or unsubstituted cyclic aromatic group. In certain embodiments, the aryl group includes phenyl, benzyl, naphthyl, tolyl, anthracyl, nitrophenyl, or halophenyl. In certain embodiments, the heteroaryl group comprises an aryl group with one or more heteroatoms in the ring, for instance furyl, pyridyl, pyrrolyl, phenanthryl. In certain aspects, a boronic compound can comprise a mixture of boronic compounds.

Particular examples of boronic acids include, but are not limited to, boric acid, B(OH)3, methyl boronic acid, phenyl boronic acid, 3,5-dichlorophenyl boronic acid, 3,5-bis(trifluoromethyl)phenyl boronic acid, 2-methoxyphenyl boronic acid, 3-methoxyphenyl boronic acid, 4-methoxyphenyl boronic acid, 4-carboxyphenyl boronic acid, 2-nitrophenyl boronic acid, 4-nitrophenyl boronic acid, 4-bromophenyl boronic acid, 4-fluorophenyl boronic acid, 2-methylphenyl boronic acid, 3-methylphenyl boronic acid, 4-methylphenyl boronic acid, 3,5-dimethylphenyl boronic acid, 3-methoxycarbonyl-5-nitrophenyl boronic acid, 2-fluoro-5-nitrophenyl boronic acid, 3-pyridyl boronic acid, 3-benzyl-3-pyridylium boronic acid, 8-quinolinyl boronic acid, 2-($R_1R_2NCH_2$)phenyl boronic acid.

Further information regarding boronic acid, boronic esters, and derivatives thereof can be found in "*Boronic Acids: Preparation and Applications in Organic Synthesis, Medicine and Materials*", Second Edition, Edited by Dennis G. Hall, 2011 Wiley-VCH Verlag GmbH & Co. KGaA, which is hereby incorporated herein by reference.

Each of the original claims set forth at the end of the present application are hereby incorporated into this Summary section by reference in its entirety.

The foregoing, and other aspects and embodiments described herein all constitute embodiments of the present invention.

It should be appreciated by those persons having ordinary skill in the art(s) to which the present invention relates that any of the features described herein in respect of any particular aspect and/or embodiment of the present invention can be combined with one or more of any of the other features of any other aspects and/or embodiments of the present invention described herein, with modifications as appropriate to ensure compatibility of the combinations. Such combinations are considered to be part of the present invention contemplated by this disclosure.

It is to be understood that both the foregoing general description and the following detailed description are exemplary and explanatory only and are not restrictive of the invention as claimed. Other embodiments will be apparent to those skilled in the art from consideration of the specification and practice of the invention disclosed herein.

DETAILED DESCRIPTION OF THE INVENTION

The present invention is directed to methods of making semiconductor nanocrystals (also referred to herein as quantum dots). Semiconductor nanocrystals of certain size can be made according to a reaction process described herein. Growth of semiconductor nanocrystals can optionally be terminated or quenched before Ostwald ripening or broadening of the size distribution of the semiconductor particles occurs. As described above, semiconductor nanocrystal precursors for making the semiconductor nanocrystals can be combined in a variety of manners. In certain embodiments, it may be desirable to add a semiconductor nanocrystal precursor to the reaction mixture in a controlled manner. Aspects of addition that can be controlled include, but are not limited to, rate of addition, size or amount of each addition, order of addition (e.g., sequential, alternating, etc.). In certain embodiments, it may be desirable to add a semiconductor nanocrystal precursor to the reaction mixture in a in a continuous manner. The size of the semiconductor nanocrystals or core particles so formed may be further increased to a certain size by the reaction of additional amounts of semiconductor nanocrystal precursors on an outer surface of the semiconductor nanocrystals or core particles. In certain embodiments, there may be an excess amount of one of the semiconductor nanocrystal precursors present after the semiconductor nanocrystals are formed, in which case, additional amounts of the complementary semiconductor precursor can be introduced to increase the size of the semiconductor nanocrystals. In certain embodiments, it may be desirable to introduce additional amounts of semiconductor nanocrystal precursor(s) to the reaction mixture in a controlled manner. Aspects of addition that can be controlled include, but are not limited to, rate of addition, size or amount of each addition, order of addition (e.g., sequential, alternating, etc In certain embodiments, it may be desirable to introduce additional amounts of semiconductor nanocrystal precursor(s) to the reaction mixture in a continuous manner. According to one embodiment, the semiconductor nanocrystals may be isolated from the reaction medium and then subjected to conditions to facilitate further growth of the particles to, for example, obtain a semiconductor nanocrystal having a desired size and/or a semiconductor nanocrystal with a desired peak emission wavelength. According to an additional embodiment, the semiconductor nanocrystals can be produced by separate nucleation and growth steps. According to a still further embodiment, the semiconductor nanocrystals produced by the methods of the present invention may further be provided with a coating or shell or layer. According to an additional embodiment, the semiconductor nanocrystals produced by the methods described herein need not be purified prior to being provided with a coating or layer or shell.

According to certain aspects of the present invention, core semiconductor nanocrystals may be formed from semiconductor nanocrystal precursors. For example, semiconductor nanocrystals comprising a semiconductor material that can be represented by the formula MX, wherein M represents one or more metals and X represents one or more chalcogens and/or one or more pnictogens, can be formed from semiconductor nanocrystal precursors comprising one or more M donors and one or more X donors. According to certain aspects, an X donor and M donor are combined in the presence of a boronic compound at a reaction temperature to form a reaction mixture.

As discussed above, the manner in which the semiconductor X donor, the M donor, and the boronic compound are combined can vary. For example, an X donor can be added to a mixture of an M-donor, the boronic compound, and the liquid medium; an M donor can be added to a mixture of an X-donor, the boronic compound, and the liquid medium; an M donor, an X donor can be separately added to a mixture of the boronic compound and the liquid medium; an M donor, an X donor, and the boronic compound can be separately added to the liquid medium; an M-donor and a mixture of an X donor and the boronic compound can be separately added to the liquid medium; an X-donor and a mixture of an M donor and the boronic compound can be separately added to the liquid medium. In the above examples, separate additions may be carried out simultaneously, sequentially, or in an alternating manner. Additions may also be made in other various manners. For example, additions may be made as a single addition or as a series of periodic additions. Other variations may also be determined to be desirable by the skilled artisan.

In certain embodiments, it may be desirable to terminate or quench the reaction so as to stop growth of the semiconductor nanocrystals before the semiconductor nanocrystals ripen or broaden or combine together. For example, the reaction can be terminated or quenched by cooling the reaction mixture to a quenching temperature effective to terminate or quench the reaction process.

In certain embodiments, it may be desirable to continue to heat the reaction mixture at a temperature that is the same as, higher than, or lower than, the reaction temperature after the reaction of the precursors for a period of time sufficient to achieve the desired nanocrystal before the reaction is terminated or quenched.

According to a certain aspect, an M donor and an X donor are combined at a reaction temperature in the presence of a boronic compound to form semiconductor nanocrystals in a reaction mixture. In certain aspects, a solution including an M donor, a boronic compound, and a liquid medium is provided at a reaction temperature, such as by heating, after which an X donor is added to the solution of the metal source whereupon nanocrystals including the M component of the M donor and the X component of the X donor form in a reaction mixture. The reaction can be terminated resulting in nanocrystals of certain size. Alternatively, an M donor can be added to a solution including an X donor, a boronic compound, and a liquid medium at a reaction temperature to form a reaction mixture. The reaction is then terminated or quenched. In certain aspects, an M donor and an X donor can be added to a reaction medium simultaneously, where the boronic compound is either also separately added to the reaction medium, added to the reaction medium prior to addition of the M donor(s) and X donor(s), or is pre-combined with one or both of an M donor and X donor prior to addition of the M donor or X donor to the reaction medium. The reaction can be terminated according to methods known to those of skill in the art which may include termination by use of a chemical agent, termination by use of a temperature reduction, termination by use of isolation material or dilution of reactive ingredients to a point where the reactive ingredients are no longer effectively reactive. According to one aspect, the reaction is terminated by rapidly cooling the reaction mixture to a quenching temperature substantially below that of the reaction temperature. It is to be understood that different reaction temperatures may exist for different reaction mixtures. Likewise, it is to be understood that different quenching temperatures may exist for different reaction mixtures. Reaction temperatures include those at which semiconductor nanocrystals may be created and quenching temperatures include those at which the reaction is terminated or quenched resulting in semiconductor nanocrystals of desired size. Semiconductor nanocrystals are then present in the reaction vessel and then may be isolated or recovered. As discussed above, the manner in which M donors and X donors can be provided to a reaction vessel including the semiconductor nanocrystals can vary. For example, M donors and/or X donors can be added as a single addition, as a substantially steady or substantially constant infusion or feed or source such that as M donor and X donor are consumed or otherwise used to grow the semiconductor nanocrystals. Additional supply of M donor and X donor is provided to the reaction vessel in amounts to achieve a desired semiconductor nanocrystal size. Determination of such amounts is within the skill of the person of ordinary skill in the art.

According to a certain aspect, a solution of a first semiconductor nanocrystal precursor (e.g., M donor or X donor), a boronic compound, and a liquid medium is provided at a reaction temperature, such as by heating, after which a second semiconductor nanocrystal precursor (the X donor or M donor that complements the first semiconductor nanocrystal precursor to make the desired semiconductor nanocrystal) is added, such as by injection, into the solution of the first semiconductor nanocrystal precursor to form a reaction mixture whereupon the M component from the M donor and the X component from the X donor react in the presence of the boronic compound to form the desired semiconductor nanocrystals. For highly reactive precursors, it may be desirable, immediately after addition of the second semiconductor nanocrystal precursor is completed, to rapidly cool the reaction mixture to a quenching temperature thereby terminating or quenching the growth of nanocrystals. According to a certain aspect, the reaction, i.e. growth of nanocrystals, is terminated thereby resulting in nanocrystals of certain size by quenching methods known to those of skill in the art. For precursors that are not highly reactive, continued heating at the reaction temperature or a higher temperature for a period of time to, for example, obtain the desired semiconductor nanocrystal size, may be desirable, before terminating or quenching the reaction. A reaction can be terminated by rapidly cooling the reaction mixture to a temperature substantially below that of the reaction temperature. Semiconductor nanocrystals are then present in the reaction vessel and then may be isolated or recovered.

According to a certain aspect, semiconductor nanocrystals of certain desired size are created by selecting a certain initial reaction temperature of a solution of an M donor followed by rapid addition, such as by injection, of an X donor to produce a reaction mixture that also includes a boronic compound and a liquid medium. After reaction of the M donor and X donor in the presence of the boronic compound to produce the desired semiconductor nanocrystals, the semiconductor nanocrystals produced may then optionally further be contacted with additional amount of M donors and X donors that are provided to a reaction vessel including the semiconductor nanocrystals to continue growth of the semiconductor nanocrystals until a desired semiconductor nanocrystal size is reached.

In embodiments of the method for preparing semiconductor nanocrystals including a chalcogen constituent, an X donor comprising a secondary phosphine chalcogenide or secondary phosphine chalcogenide precursor or oxygen-treated tertiary phosphine can be used. In certain embodiments, the secondary phosphine chalcogenide precursor comprises at least 10% secondary phosphine chalcogenide by weight, e.g., at least 20% secondary phosphine chalcogenide by weight, at least 30% secondary phosphine chalcogenide by weight, at least 40% secondary phosphine chalcogenide by weight, at least 50% secondary phosphine chalcogenide by weight, at least 60% secondary phosphine chalcogenide by weight, at least 70% secondary phosphine chalcogenide by weight, at least 80% secondary phosphine chalcogenide by weight, at least 90% secondary phosphine chalcogenide by weight, up to 100% secondary phosphine chalcogenide by weight.

In the present invention described herein, an oxygen-treated tertiary phosphine chalcogenide can comprise liquid tertiary phosphine chalcogenide that is exposed to air or other gas including oxygen. Exposure can include, for example, bubbling air or other oxygen containing gas into the liquid tertiary phosphine chalcogenide, flowing air or other oxygen containing gas over the surface of the liquid, or other techniques readily ascertained by the skilled artisan. Preferably the air or other gas including oxygen to which the liquid tertiary phosphine chalcogenide is exposed is dry. In certain embodiments, such exposure is carried out at room temperature, e.g., without the application of heat. The addition of air or other gas including oxygen is carried out to convert at least a portion of the tertiary phosphine chalcogenide to a secondary phosphine chalcogenide. The addition of air or other gas including oxygen, however, should be stopped before all the secondary phosphine formed is converted into other chemical species. Examples of tertiary phosphines include, but are not limited to, trialkyl phosphines such as tri-n-octylphosphine, tri-n-butylphosphine, and tri-aryl phosphines.

Semiconductor nanocrystals may be made according to the present invention in the absence of amine compounds in the reaction mixture. According to this aspect, a reaction mixture is substantially free of amine compounds or substantially excludes amine compounds.

Semiconductor nanocrystals may be made according to the invention described herein with ligands attached to the surface of the semiconductor nanocrystals. According to this aspect, ligand-providing compounds can be included into the reaction mixture used to produce the semiconductor nanocrystals. Such ligand-providing compounds include carboxylates, phosphonates, phosphonites and the like.

As discussed above, semiconductor nanocrystals produced by the methods described herein can then be coated with one or more coatings including semiconductor materials. A coating layer can comprise one or more inorganic materials. A coating layer can comprise one or more semiconductor materials. A coating layer can comprise one or more different semiconductor materials. A coating layer can comprise more than one layer. When multiple layers are included on the semiconductor nanocrystals, each layer can have a composition that is the same or different from that of an adjacent layer. When multiple layers are included on the semiconductor nanocrystals, each layer can have a composition that is the same or different from that of any other layer.

Aspects of the present invention relate to a method for preparing semiconductor nanocrystals. Semiconductor nanocrystals or nanocrystals are nanometer sized semiconductor particles that can have optical properties arising from quantum confinement. Semiconductor nanocrystals can have various shapes, including, but not limited to, a sphere, a rod, a disk, other shapes, and mixtures of various shaped particles. The particular composition(s), structure, and/or size of a semiconductor nanocrystal can be selected to achieve the desired wavelength of light to be emitted from the semiconductor nanocrystal upon stimulation with a particular excitation source. Semiconductor nanocrystals may be tuned to emit light across the visible spectrum by changing their size. See C. B. Murray, C. R. Kagan, and M. G. Bawendi, *Annual Review of Material Sci.,* 2000, 30: 545-610 hereby incorporated by reference in its entirety. The narrow FWHM of semiconductor nanocrystals can result in saturated color emission. In certain embodiments, FWHM can be, for example, less than 60 nm, less than 50 nm, less than 40 nm, or less than 30 nm. The broadly tunable, saturated color emission over the entire visible spectrum of a single material system is unmatched by any class of organic chromophores (see, for example, Dabbousi et al., *J Phys. Chem.* 101, 9463 (1997), which is incorporated by reference in its entirety). A monodisperse population of semiconductor nanocrystals will emit light spanning a narrow range of wavelengths.

Semiconductor nanocrystals can comprise binary materials, ternary materials, or quaternary materials.

According to an exemplary embodiment, semiconductor nanocrystals of a certain size are formed by reacting one or more semiconductor nanocrystal precursors in the presence of a boronic compound in a liquid medium at a reaction temperature and for a period of time sufficient to create semiconductor nanocrystals of desired size. When the desired size is achieved, the reaction can be terminated or quenched, such as by cooling the reaction mixture to a quenching temperature at which the reaction substantially terminates and the particles precipitate out of solution. Optionally, the resulting semiconductor nanocrystals may be collected or isolated.

In a second step, the semiconductor nanocrystals can be then increased in size or "grown" when the semiconductor nanocrystals are combined with an M donor and an X donor under conditions where the M component of the M donor and the X component of the X donor combine with the semiconductor nanocrystals to create a larger semiconductor nanocrystal over time. Accordingly, exemplary methods described herein may have a first core-producing step and a second growth step to produce semiconductor nanocrystals of a given size.

According to one aspect, a method for making semiconductor nanocrystals comprises reacting one or more semiconductor nanocrystal precursors in the presence of a boronic compound in a liquid medium at a reaction temperature and for a period of time sufficient to create semiconductor nanocrystals of desired size, following which additional amounts of the same one or more semiconductor nanocrystal precursors are added to the semiconductor nanocrystals, preferably in the presence of a boronic compound, under conditions suitable to increase the size of the semiconductor nanocrystals. According to one aspect, the X donor includes oxygen, sulfur, selenium, tellurium, nitrogen, phosphorus, arsenic, and/or antimony. According to one aspect, the metal is cadmium, zinc, magnesium, mercury, aluminum, gallium, indium, thallium, lead and/or germanium.

A reaction temperature is preferably sufficient for reacting one or more metal sources and one or more chalcogen and/or pnictogen sources to form a semiconductor material comprising one or more metals and one or more chalcogens and/or pnictogens.

According to aspects of the present disclosure, an exemplary reaction temperature is between about 125° C. and about 400° C., between about 150° C. and about 350° C., between about 175° C. and about 325° C., between about 200° C. and about 300° C., above about 150° C., above about 175° C., above about 200° C., above about 225° C., above about 250° C., above about 260° C., above about 270° C., above about 275° C., above about 280° C., above about 290° C., above about 300° C., above about 310° C., above about 320° C., and the like.

In certain embodiments, a quenching temperature is selected to be sufficient to slow, and preferably stop, further reaction of one or more metal sources and one or more X sources.

An exemplary quenching temperature at which the reaction produces semiconductor nanocrystals is about 200° C. or below about 200 ° C. According to certain aspects of the present disclosure, a quenching temperature is substantially lower than a reaction temperature. An exemplary quenching temperature is between about 50 ° C. and about 150 ° C. lower than a given reaction temperature, between about 75° C. and about 125 ° C. lower than a given reaction temperature, or about 100° C. lower than a given reaction temperature. An exemplary quenching temperature is between about 175° C. and about 75° C., between about 150° C. and about 100° C., between about 125° C. and about 100° C., lower than about 150° C., lower than about 125° C., lower than about 100° C. and the like. An exemplary quenching temperature at which the reaction substantially terminates but the semiconductor nanocrystals precipitate out of solution is about 100° C. or below about 100° C. The semiconductor nanocrystals are then isolated or recovered or purified prior to further processing.

In accordance with one aspect, the ratio of moles of chalcogen to moles of metal in the reaction mixture is greater than or equal to one.

In accordance with one aspect, the ratio of moles of pnictogen to moles of metal in the reaction mixture is less than or equal to one.

In accordance with one aspect, the ratio of moles of boronic compound to moles of metal in the semiconductor nanocrystal precursor in the reaction mixture is at least one.

In accordance with one aspect, there is provided a method for preparing semiconductor nanocrystals comprising a III-V semiconductor material. The method comprises reacting a Group IIIA metal-donor and a Group VA-donor in the presence of a boronic compound, (e.g., but not limited to, alkyl or aryl (e.g., phenyl) boronic acid) in a liquid medium at reaction temperature for a sufficient time to form the nanocrystals. The mixture including the nanocrystals can further be heated after formation of the nanocrytals for an additional period of time at a temperature higher than the reaction temperature, e.g., to anneal the nanocrystals. The size of the nanocrystals can be increased by reacting additional amounts of precursors in a liquid medium including the nanocrystals, preferably in the presence of a boronic compound. Such additional amounts of precursor can added to the mixture. Alternatively, if there is an excess of one of the precursors present in the mixture after formation of the nanocrystals, additional amounts of such precursor may not need to be added to the mixture for the additional growth step. For example, in certain embodiments, the Group IIIA-donor is included in the initial reaction mixture in a molar amount in excess of the Group VA-donor, additional growth of the nanocrystal may comprise adding additional amounts of Group VA-donor. Optionally, the nanocrystals can be isolated from the reaction mixture before further processing (e.g., additional growth and/or overcoating).

According to an additional aspect, the semiconductor nanocrystals which have been isolated or recovered or purified are then increased in size or "grown" when the semiconductor nanocrystals are combined with a metal source or donor and a chalcogen and/or pnictogen source or donor under conditions where the metal and the chalcogenide and/or pnictide combine with the semiconductor nanocrystals to create a larger semiconductor nanocrystal over time. Accordingly, exemplary methods described herein may have a first core-producing step and a second growth step to produce semiconductor nanocrystals of a given size.

Exemplary semiconductor nanocrystals according to the present disclosure include those having metal from the metal precursors and chalcogen from, for example, including but not limited to, a secondary phosphine chalcogenide or secondary phosphine chalcogenide precursor compound or oxygen-treated tertiary phosphine chalcogenide. Accordingly, exemplary semiconductor nanocrystals include those of the formula MX, where M is a metal from a metal donor and X is a compound from an X donor which is capable of reacting with the metal donor to form a material with the general formula MX. In certain embodiments, the M donor and the X donor can be moieties within the same molecule.

Exemplary semiconductor nanocrystals according to the present disclosure include those having metal from the M donor and pnictogens from the X donor. Accordingly, exemplary semiconductor nanocrystals include those of the formula MX, where M is a metal from a metal donor and X is a compound from an X donor which is capable of reacting with the metal donor to form a material with the general formula MX. In certain embodiments, the M donor and the X donor can be moieties within the same molecule.

The M donor or metal precursor can be an inorganic compound, an organometallic compound, or elemental metal.

Metal precursors (or M donors) can constitute a wide range of substances, such as elements, covalent compounds, ionic compounds, and/or coordination complexes, that serve as a source for the metal constituent of the resulting nanocrystal. Examples of M donors include, but are not limited to, a metal oxide, a metal carbonate, a metal bicarbonate, a metal sulfate, a metal sulfite, a metal phosphate, metal phosphite, a metal halide, a metal carboxylate, other metal salts, a metal alkoxide, a metal thiolate, a metal amide, a metal imide, a metal alkyl, a metal aryl, a metal coordination complex, a metal solvate, and the like. Other M donors can be readily ascertained by one of ordinary skill in the art.

Examples of metals include cadmium, zinc, magnesium, mercury, aluminum, gallium, indium, thallium, or mixtures. Other metals that can react to form a semiconductor comprising an inorganic semiconductor compound including a chalcogen and/or pnictogen can also be used.

Exemplary metal precursors include dimethylcadmium, cadmium oleate, trialkyl indium, indium myristate. For example, an M donor or metal precursor can comprise other sources of cadmium, zinc, magnesium, mercury, aluminum, gallium, indium, thallium, lead, germanium or mixtures thereof.

The X donor can comprise a compound capable of reacting with the M donor to form a material with the general formula MX.

The X donor can comprise a chalcogen or chalcogenide donor where X can comprise oxygen, sulfur, selenium, or tellurium, or mixtures thereof. Suitable chalcogenide donors include, but are not limited to, reactive chalcogenide source, such as highly reactive chalcogenide sources such as $(TMS)_2Se$, $(TMS)_2S$, $H_2S$, chalcogenide mixtures such as octadecene-Se, (ODE/Se), octadecene-S (ODEs), amine-Se, amine-S, oxygen-treated tertiary phosphine chalcogenide and mixtures thereof and secondary phosphine chalcogenides include a secondary phosphine sulfide, a secondary phosphine selenide, a secondary phosphine telluride, or a secondary phosphine oxide, dialkyl phosphine chalcogenides such as diisobutylphosphine selenides, diisobutylphosphine sulfides, diphenylphosphine selenides, diphenylphosphine sulfides or mixtures thereof or mixtures of any of the above.

The X donor can comprise a pnictogen or pnictide donor where X can comprise nitrogen, phosphorus, arsenic, antimony or mixtures thereof. Suitable pnictogen donors include elements, covalent compounds, or ionic compounds that serve as a source for a Group VA element(s) in the resulting nanocrystal. Group VA donors are most often selected from the Group VA elements themselves (oxidation state 0), covalent compounds, or ionic compounds of the group V elements (N, P, As, or Sb). For example, non-limiting examples of phosphorus precursors include $P(SiR_3)_3$ wherein R=methyl, ethyl, propyl, butyl, pentyl, hexyl, isopropyl, isobutyl, tert-butyl, etc.), and phosphine. Other Group VA precursors can be readily ascertained by one of ordinary skill in the art.

As discussed above, an X donor can comprise a chalcogenide donor and/or a pnictide donor, such as a phosphine chalcogenide, a bis(silyl) chalcogenide, dioxygen, an ammonium salt, or a tris(silyl) pnictide. Suitable X donors include, for example, but are not limited to, dioxygen, bis(trimethylsilyl) selenide $((TMS)_2Se)$, trialkyl phosphine selenides such as (tri-noctylphosphine) selenide (TOPSe) or (tri-n-butylphosphine) selenide (TBPSe), trialkyl phosphine tellurides such as (tri-n-octylphosphine) telluride (TOPTe) or hexapropylphosphorustriamide telluride (HPPTTe), bis(t-rimethylsilyl)telluride $((TMS)_2Te)$, bis(trimethylsilyl)sulfide $((TMS)_2S)$, a trialkyl phosphine sulfide such as (tri-noctylphosphine) sulfide (TOPS), an ammonium salt such as an ammonium halide (e.g., $NH_4Cl$), tris(trimethylsilyl) phosphide $((TMS)_3P)$, tris(trimethylsilyl) arsenide $((TMS)_3As)$, or tris(trimethylsilyl) antimonide $((TMS)_3Sb)$. In certain embodiments, the M donor and the X donor can be moieties within the same molecule.

Examples of materials suitable for use as semiconductor nanocrystal cores include, but are not limited to, ZnO, ZnS, ZnSe, ZnTe, CdO, CdS, CdSe, CdTe, MgS, MgSe, GaAs, GaN, GaP, GaSe, GaSb, HgO, HgS, HgSe, HgTe, InAs, InN, InP, AlAs, AlN, AlP, AlSb, TlN, TlP, TlAs, TlSb, PbO, PbS, PbSe, PbTe, Ge, Si, an alloy including any of the foregoing, and/or a mixture including any of the foregoing, including ternary and quaternary mixtures or alloys.

A semiconductor nanocrystal (including a semiconductor nanocrystal core of a core/shell semiconductor nanocrystal) can comprise one or more semiconductor materials at least one of which comprises at least one metal and at least one chalcogen and/or pnictogen. Examples of semiconductor materials include, but are not limited to, Group II-VI compounds (e.g., binary, ternary, and quaternary compositions), Group III-VI compounds (e.g., binary, ternary, and quaternary compositions), Group IV-VI compounds (e.g., binary, ternary, and quaternary compositions), Group compounds (e.g., binary, ternary, and quaternary compositions), Group II-IV-VI compounds (e.g., binary, ternary, and quaternary compositions), and alloys including any of the foregoing, and/or a mixture including any of the foregoing. Semiconductor nanocrystals can also comprise one or more semiconductor materials that comprise ternary and quaternary alloys that include one or more of the foregoing compounds. Examples of Group II elements include Zn, Cd, and Hg. Examples of Group VI elements include oxygen, sulfur, selenium and tellurium. Examples of Group III elements include boron, aluminum, gallium, indium, and thallium. Examples of Group V elements include nitrogen, phosphorus, arsenic antimony, and bismuth. Examples of Group IV elements include silicon, germanium, tin, and lead.

As discussed herein, a semiconductor nanocrystal on which a coating is grown in accordance with the present invention can comprise one or more coatings or shells over a surface of the core. A shell typically comprises a semiconductor material. A shell can comprise a Group II-VI compound, Group II-V compound, Group III-VI compound, Group III-V compound, Group IV-VI compound, Group compound, Group II-IV-VI compound, and Group II-IV-V compound. Non-limiting examples of such semiconductor materials include, but are not limited to, ZnS, ZnSe, ZnTe, CdS, CdSe, CdTe, HgS, HgSe, HgTe, AlN, AlP, AlAs, AlSb, GaN, GaP, GaAs, GaSb, GaSe, InN, InP, InAs, InSb, TlN, TlP, TlAs, TlSb, PbS, PbSe, PbTe, a mixture including any one or more of the foregoing, an alloy including any one or more of the foregoing, etc. In certain embodiments, a shell can comprise a Group IV element.

In certain embodiments, the liquid medium includes solvents such as coordinating solvents. Alternatively, non-coordinating solvents can also be used in certain applications. A coordinating solvent is a compound having a donor lone pair, for example, a lone electron pair available to coordinate to a surface of the growing semiconductor nanocrystal (including, e.g., a semiconductor nanocrystal). Solvent coordination can stabilize the growing semiconductor nanocrystal. Examples of coordinating solvents include alkyl phosphines, alkyl phosphine oxides, alkyl phosphonic acids, or alkyl phosphinic acids, however, other coordinating solvents, such as pyridines, furans, and amines may also be suitable for the semiconductor nanocrystal (e.g., semiconductor nanocrystal) production. Additional examples of suitable coordinating solvents include pyridine, tri-n-octyl phosphine (TOP), tri-n-octyl phosphine oxide (TOPO) and trishydroxylpropylphosphine (tHPP), tributylphosphine, tri (dodecyl)phosphine, dibutyl-phosphite, tributyl phosphite, trioctadecyl phosphite, trilauryl phosphite, tris(tridecyl) phosphite, triisodecyl phosphite, bis(2-ethylhexyl)phosphate, tris(tridecyl) phosphate, hexadecylamine, oleylamine, octadecylam ine, bis(2-ethylhexyl)amine, octylamine, dioctylamine, trioctylamine, dodecylamine/laurylamine, didodecylamine tridodecylamine, hexadecylamine, dioctadecylamine, trioctadecylamine, phenylphosphonic acid, hexylphosphonic acid, tetradecylphosphonic acid, octylphosphonic acid, octadecylphosphonic acid, propylenediphosphonic acid, phenylphosphonic acid, aminohexylphosphonic acid, dioctyl ether, diphenyl ether, methyl myristate, octyl octanoate, N-dodecylpyrrolidone (NDP), and hexyl octanoate. In certain embodiments, technical grade TOPO can be used.

In certain embodiments, the liquid medium includes solvents such as weakly coordinating solvents. In certain embodiments, the liquid medium includes solvents such as non-coordinating solvents. Examples of non-coordinating solvents for use in the methods taught herein include, but are not limited to, squalane, octadecane, or any other saturated hydrocarbon molecule. Weakly coordinating and other non-coordinating solvents for use in the methods taught herein can be readily ascertained by one of ordinary skill in the art.

In certain embodiments, a solvent with a boiling point greater than 250° C. may be useful or desirable.

In certain aspects, a solvent can comprise a mixture of solvents.

According to a certain aspect, reaction mixtures described herein may be degassed. Reagents, components or solvents may be placed in a reaction vessel and degassed to the extent that oxygen is removed to create an oxygen-free condition. Additional reagents, components or solvents may be added to the reaction vessel under oxygen-free conditions. According to one aspect, one or more reagents, components or solvents of the reaction mixture are degassed and the one or more reagents, components or solvents are combined together. According to one aspect, all reagents, components or solvents of the reaction mixture are degassed and are combined together. According to one aspect, a degassed or oxygen-free reaction mixture is provided for producing semiconductor nanocrystals. According to one aspect, the reaction mixture is under oxygen-free conditions. An oxygen-free condition refers to a condition or an atmosphere where oxygen is substantially or completely absent. An oxygen-free condition can be provided by a nitrogen atmosphere or other inert gas atmosphere where oxygen is absent or substantially absent. In addition, an oxygen-free condition can be provided by removing oxygen from a reagent or reaction mixture such as by placing the reagent or reaction mixture under vacuum or forcing an inert gas through the reagent or reaction mixture to remove oxygen or both.

According to one aspect, the M component from the M donor and the X component from the X donor, for example the metal and the chalcogen and/or pnictogen species react together in the presence of a boronic compound in a colloidal growth process to produce semiconductor nanocrystals.

After semiconductor nanocrystals are formed in the reaction vessel, the reaction may be terminated or quenched by, for example, cooling the reaction mixture. According to one aspect, the reaction vessel is cooled to a temperature of below about 100° C. or lower using a suitable heat sink. According to one aspect, the reaction vessel is submerged in a cooling bath such that rapid cooling of the reaction mixture is achieved. Cooling baths according to the present disclosure include any suitable cooling bath medium. Exemplary cooling baths include water or other fluids which can be maintained at low temperatures suitable for rapidly cooling reaction media and include a bath of squalane cooled with liquid nitrogen. The reaction vessel can then be contacted with the bath and the temperature of the reaction vessel is lowered to a temperature at which the reaction terminates.

The semiconductor nanocrystals produced can then be further combined with an M donor or metal precursor and an X donor, preferably in the presence of a boronic compound, under conditions which allow the semiconductor nanocrystals to grow in size by addition of additional amounts of M donor and X donor.

Semiconductor nanocrystals can be isolated or recovered, for example by precipitation with additional of butanol and methanol in a ratio of 1 to 1.5 to 0.5 v/v/v semiconductor nanocrystal stock solution to butanol to methanol, and then placed into a non-coordinating solvent in a reaction vessel at a temperature of between about 200° C. to about 250° C., between about 210° C. to about 240° C. or between about 220° C. to about 240° C. Non-coordinating solvents include 1-decene, 1-dodecene, 1-tetradecene, 1-hexadecene, 1-octadecene, 1-icosene and 1-docosene and the like.

According to one aspect, the semiconductor nanocrystal, which may be also referred to as a core, is continuously grown in size from its initial size to a final size or from an initial first absorbance peak to a final absorbance peak. For example, the core may have an initial first absorbance peak of between about 420 nm to about 480 nm. The core may be grown, such as continuously, to a final first absorbance peak of between about 450 nm to about 600 nm, such as 500 nm, 520 nm, 540 nm, 560 nm or 580 nm. According to this aspect, the semiconductor nanocrystals or cores are grown to a final size or final first absorbance peak as precursors are continuously added to the reaction vessel.

Resulting semiconductor nanocrystals are members of a population of semiconductor nanocrystals.

The present invention will be further clarified by the following examples, which are intended to be exemplary of the present invention.

EXAMPLE

Preparation of Indium Phosphide Semiconductor Nanocrystal Cores

A squalane solution of 10 mL of indium myristate (0.8 mmoles) with 100 mg phenyl boronic acid is prepared. The mixture is degassed and heated to 192° C. A Dowtherm A (4 mL)/tris(trimethylsilyl)phosphine (135 mg, 1:0.64 vs In) solution is injected into a reaction vessel including the mixture including indium myristate and the boronic acid in squalane. The indium myristate and tris(trimethylsilyl)phosphine are allowed to react at 180° C. for 15 minutes at which time the reaction mixture is heated to 250° C. for 3 hours. (Absorbance 520-535 nm).

The presence of boronic acid in the reaction mixture allows for the additional growth of the indium phosphide semiconductor nanocrystals via subsequent addition of additional tris(trimethylsilyl)phosphine (a phosphorus source (or X donor)). Addition of ligands (e.g., but not limited to, a thiol compound, a phenol compound, an amine compound, an acid compound) can allow for further variation of the nanocrystal growth rate and size distribution during additional growth. The ligand can also assist in maintaining size distribution during the additional growth regime. Without boronic acid, subsequent addition of phosphine precursors results in little growth concurrent with a broadening of the InP nanocrystal size distribution. Addition of ligand can also play a role in the overcoating process. For example, semiconductor nanocrystal cores synthesized with thiol ligands can result in core/shell materials with very low quantum yields (10-15%) wherein cores synthesized with phenol ligands can result in core/shell materials with much higher quantum yields (50%). It is believed that the boronic acid facilitates tuning the surface chemistry of the InP cores, influencing overcoating thereof. It is believed that the boronic acid facilitates tuning the surface chemistry of the InP cores, which can also influence ease of isolating and filtering the InP cores.

It is believed that synthesizing semiconductor nanocrystals in the presence of a boronic compound can achieve controlled growth of semiconductor nanocrystals and improved monodisperse distribution of diameters.

The monodisperse distribution of diameters can also be referred to as a "size." Preferably, a monodisperse population of particles includes a population of particles wherein at least about 60% of the particles in the population fall within a specified particle size range. A population of monodisperse particles preferably deviate less than 15% rms (root-mean-square) in diameter and more preferably less than 10% rms and most preferably less than 5% rms.

In general, semiconductor nanocrystals according to the present disclosure can have an average particle size in a range from about 1 to about 1000 nanometers (nm), and preferably in a range from about 1 to about 100 nm. In certain embodiments, semiconductor nanocrystals have an average particle size in a range from about 1 to about 20 nm (e.g., such as about 2, 3, 4, 5, 6, 7, 8, 9, 10, 11, 12, 13, 14, 15, 16, 17, 18, 19, or 20 nm). In certain embodiments, semiconductor nanocrystals have an average particle size in a range from about 1 nm to about 20 nm or about 1 nm to about 10 nm. Semiconductor nanocrystals can have an average diameter less than about 150 Angstroms (Å). In certain embodiments, semiconductor nanocrystals having an average diameter in a range from about 12 to about 150 Å can be particularly desirable. However, depending upon the composition, structure, and desired emission wavelength of the semiconductor nanocrystal, the average diameter may be outside of these ranges.

In certain embodiments, semiconductor nanocrystals can include a core having one or more semiconductor materials and a shell comprising one or more semiconductor materials, wherein the shell is disposed over at least a portion, and preferably all, of the outer surface of the core. A semiconductor nanocrystal including a core and shell is also referred to as a "core/shell" structure.

As discussed herein, a shell can be a semiconductor material. The shell can comprise an overcoat including one or more semiconductor materials on a surface of the core. Examples of semiconductor materials that can be included in a shell include, but are not limited to, a Group IV element, a Group II-VI compound, a Group II-V compound, a Group III-VI compound, a Group III-V compound, a Group IV-VI compound, a Group I-III-VI compound, a Group II-IV-VI compound, a Group II-IV-V compound, alloys including any of the foregoing, and/or mixtures including any of the foregoing, including ternary and quaternary mixtures or alloys. Examples include, but are not limited to, ZnO, ZnS, ZnSe, ZnTe, CdO, CdS, CdSe, CdTe, MgS, MgSe, GaAs, GaN, GaP, GaSe, GaSb, HgO, HgS, HgSe, HgTe, InAs, InN, InP, InSb, AlAs, AlN, AlP, AlSb, TlN, TlP, TlAs, TlSb, PbO, PbS, PbSe, PbTe, Ge, Si, an alloy including any of the foregoing, and/or a mixture including any of the foregoing. For example, ZnS, ZnSe or CdS overcoatings can be grown on CdSe or CdTe semiconductor nanocrystals.

In a core/shell semiconductor nanocrystal, the shell or overcoating may comprise one or more layers. The overcoating can comprise at least one semiconductor material which is the same as or different from the composition of the core. Preferably, the overcoating has a thickness from about one to about ten monolayers. An overcoating can also have a thickness greater than ten monolayers. In certain embodiments, more than one overcoating can be included on a core.

In certain embodiments, the surrounding "shell" material can have a band gap greater than the band gap of the core material. In certain other embodiments, the surrounding shell material can have a band gap less than the band gap of the core material.

In certain embodiments, the shell can be chosen so as to have an atomic spacing close to that of the "core" substrate. In certain other embodiments, the shell and core materials can have the same crystal structure.

Examples of semiconductor nanocrystal (e.g., semiconductor nanocrystal) (core)shell materials include, without limitation: red (e.g., (CdSe)CdZnS (core)shell), green (e.g., (CdZnSe)CdZnS (core)shell, etc.), and blue (e.g., (CdS) CdZnS (core)shell.)

An example of an overcoating process is described, for example, in U.S. Pat. No. 6,322,901 incorporated herein in its entirety by reference. By adjusting the temperature of the reaction mixture during overcoating and monitoring the absorption spectrum of the core, overcoated materials having high emission quantum efficiencies (EQE) and narrow size distributions can be obtained.

The narrow size distribution of the semiconductor nanocrystals (including, e.g., semiconductor nanocrystals) allows the possibility of light emission in narrow spectral widths. Monodisperse semiconductor nanocrystals have been described in detail in Murray et al. (*J. Am. Chem. Soc.*, 115:8706 (1993)) hereby incorporated herein by reference in its entirety.

Size distribution during the reaction process can be estimated by monitoring the absorption or emission line widths of the particles. Modification of the reaction temperature in response to changes in the absorption spectrum of the particles allows the maintenance of a sharp particle size distribution during growth. Reactants can be added to the nucleation solution during crystal growth to grow larger crystals. For example, for CdSe and CdTe, by stopping growth at a particular semiconductor nanocrystal average diameter and choosing the proper composition of the semiconducting material, the emission spectra of the semiconductor nanocrystals can be tuned continuously over the wavelength range of 300 nm to 5 microns, or from 400 nm to 800 nm.

The particle size distribution of the semiconductor nanocrystals (including, e.g., semiconductor nanocrystals) can be further refined by size selective precipitation with a poor solvent for the semiconductor nanocrystals, such as methanol/butanol. For example, semiconductor nanocrystals can be dispersed in a solution of 10% butanol in hexane. Methanol can be added dropwise to this stirring solution until opalescence persists. Separation of supernatant and flocculate by centrifugation produces a precipitate enriched with the largest crystallites in the sample. This procedure can be repeated until no further sharpening of the optical absorption spectrum is noted. Size-selective precipitation can be carried out in a variety of solvent/nonsolvent pairs, including pyridine/hexane and chloroform/methanol. The size-selected semiconductor nanocrystal (e.g., semiconductor nanocrystal) population preferably has no more than a 15% rms deviation from mean diameter, more preferably 10% rms deviation or less, and most preferably 5% rms deviation or less.

According to one aspect of the present disclosure, semiconductor nanocrystals of the present invention can include ligands attached thereto, such as aliphatic ligands. Such aliphatic ligands promote adhesion with a carrier particle. Such aliphatic ligands promote solubility or dispersability of the semiconductor nanocrystals bound to the carrier particles in a curable or polymerizable matrix material. According to one aspect, exemplary ligands include oleic acid ligands and octadecylphosphonic acid ("ODPA") ligands.

Ligands can be derived from a coordinating solvent that may be included in the reaction mixture during the growth process. Alternatively, ligands can be added to the reaction mixture or ligands can be derived from a reagent or precursor included in the reaction mixture for synthesizing the semiconductor nanocrystals. In certain embodiments, semiconductor nanocrystals can include more than one type of ligand attached to an outer surface.

A semiconductor nanocrystal surface that includes ligands derived from the growth process or otherwise can be modified by repeated exposure to an excess of a competing ligand group (including, e.g., but not limited to, a coordinating group) to exchange out the initial or native surface ligands, and/or to form an overlayer. For example, a dispersion of capped semiconductor nanocrystals can be treated with a coordinating organic compound, such as pyridine, to produce crystallites which disperse readily in pyridine, methanol, and aromatics but no longer disperse in aliphatic solvents. Such a surface exchange process can be carried out with any compound capable of coordinating to or bonding with the outer surface of the nanoparticle, including, for example, but not limited to, phosphines, thiols, amines and phosphates.

For example, a semiconductor nanocrystal can be exposed to short chain polymers which exhibit an affinity for the surface and which terminate in a moiety having an affinity for a suspension or dispersion medium, such as a curable matrix material. Such affinity improves the stability of the suspension and discourages flocculation of the semiconductor nanocrystal. Examples of additional ligands include fatty acids, long chain fatty acids such as oleic acid, alkyl phosphines, alkyl phosphine oxides, alkyl phosphonic acids, or alkyl phosphinic acids, pyridines, furans, and amines. More specific examples include, but are not limited to, pyridine, tri-n-octyl phosphine (TOP), tri-n-octyl phosphine oxide (TOPO), tris-hydroxylpropylphosphine (tHPP) and octadecylphosphonic acid ("ODPA"). Technical grade TOPO can be used.

Suitable coordinating ligands can be purchased commercially or prepared by ordinary synthetic organic techniques, for example, as described in J. March, Advanced Organic Chemistry, which is incorporated herein by reference in its entirety.

The emission from a semiconductor nanocrystal capable of emitting light can be a narrow Gaussian emission band that can be tuned through the complete wavelength range of the ultraviolet, visible, or infra-red regions of the spectrum by varying the size of the semiconductor nanocrystal, the composition of the semiconductor nanocrystal, or both. For example, a semiconductor nanocrystal comprising CdSe can be tuned in the visible region; a semiconductor nanocrystal comprising InAs can be tuned in the infra-red region. The narrow size distribution of a population of semiconductor nanocrystals capable of emitting light can result in emission of light in a narrow spectral range. The population can be monodisperse and preferably exhibits less than a 15% rms (root-mean-square) deviation in diameter of such semiconductor nanocrystals, more preferably less than 10%, most preferably less than 5%. Spectral emissions in a narrow range of no greater than about 75 nm, preferably no greater than about 60 nm, more preferably no greater than about 40 nm, and most preferably no greater than about 30 nm full width at half max (FWHM) for such semiconductor nanocrystals that emit in the visible can be observed. IR-emitting semiconductor nanocrystals can have a FWHM of no greater than 150 nm, or no greater than 100 nm. Expressed in terms of the energy of the emission, the emission can have a FWHM of no greater than 0.05 eV, or no greater than 0.03 eV. The breadth of the emission decreases as the dispersity of the light-emitting semiconductor nanocrystal diameters decreases.

Semiconductor nanocrystals can have emission quantum efficiencies such as between 0% to greater than 95%, for example in solution, such as greater than 10%, 20%, 30%, 40%, 50%, 60%, 70%, 80%, or 90%.

Semiconductor nanocrystals produced according to the present invention may be used in various applications. According to one aspect, semiconductor nanocrystals produced according to the methods described herein may be used in photoluminescent (PL) applications where semiconductor nanocrystal materials are excited optically and the optical excitation is downconverted via emission from the QDs. According to this aspect, exemplary applications include devices or systems where an LED light source is used, for example solid-state lighting, LED Backlights (LED-BLU), Liquid Crystal Displays (LCD) and the like. According to an additional aspect, semiconductor nanocrystals produced according to the methods described herein may be used in a device or system where a light source is downconverted to other wavelengths (e.g. solar concentrators or downconverters where sunlight is converted to specific wavelengths tuned to the highest efficiency window of the solar cells used in the system. Additional applications include plasma based systems where high energy plasma emission can excite a semiconductor nanocrystal downconverter, taggants, bio-labeling or imaging application, and barcoding or security/covert labeling applications. According to an additional aspect, semiconductor nanocrystals produced according to the present invention may be used in electroluminescent (EL) applications where semiconductor nanocrystals are excited electrically and the excitation results in emission from the semiconductor nanocrystals. According to this aspect, exemplary applications include direct charge injection into the semiconductor nanocrystals generating semiconductor nanocrystal excited states and subsequent semiconductor nanocrystal emission, energy transfer from other semiconductor materials within the device to the semiconductor nanocrystals, generating an excited state and subsequent semiconductor nanocrystal emission and the like. According to an additional aspect, semiconductor nanocrystals produced according to the present invention may be used in photovoltaic (PV) applications where the semiconductor nanocrystal materials are excited optically and the excitation results in current generation and/or a voltage due to carrier extraction from the semiconductor nanocrystals.

Additional information that may be useful in connection with the present disclosure and the inventions described herein is included in International Application No. PCT/US2008/10651 of Breen et al, filed 12 Sep. 2008, entitled "Functionalized Nanoparticles And Method"; and International Application No. PCT/US2007/024320 of Clough et al, filed 21 Nov. 2007, entitled "Nanocrystals Including A Group IIIa Element And A Group Va Element, Method, Composition, Device And Other Products"; International Application No. PCT/US2012/038198, filed May 16, 2012, entitled "Method for Preparing Semiconductor Nanocrystals" each of the foregoing being hereby incorporated herein by reference in its entirety.

Solid state external quantum efficiency" (also referred to herein as "EQE" or "solid state photoluminescent efficiency") can be measured in a 12" integrating sphere using a NIST traceable calibrated light source, using the method developed by de Mello et al., *Advanced Materials* 9(3):230 (1997), which is hereby incorporated by reference. Such measurements can also be made with a QEMS from Lab-Sphere (which utilizes a 4 inch sphere; e.g. QEMS-2000: World Wide Website laser2000.nl/upload/documenten/fop_21-en2.pdf).

As used herein, the singular forms "a", "an" and "the" include plural unless the context clearly dictates otherwise. Thus, for example, reference to an emissive material includes reference to one or more of such materials.

Applicants specifically incorporate the entire contents of all cited references in this disclosure. Further, when an amount, concentration, or other value or parameter is given as either a range, preferred range, or a list of upper preferable values and lower preferable values, this is to be understood as specifically disclosing all ranges formed from any pair of any upper range limit or preferred value and any lower range limit or preferred value, regardless of whether ranges are separately disclosed. Where a range of numerical values is recited herein, unless otherwise stated, the range is intended to include the endpoints thereof, and all integers and fractions within the range. It is not intended that the scope of the invention be limited to the specific values recited when defining a range.

Other embodiments of the present invention will be apparent to those skilled in the art from consideration of the present specification and practice of the present invention disclosed herein. It is intended that the present specification and examples be considered as exemplary only with a true scope and spirit of the invention being indicated by the following claims and equivalents thereof.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. A method for preparing semiconductor nanocrystals, the method comprising:
reacting one or more semiconductor nanocrystal precursors in a liquid medium in the presence of a boronic compound in a reaction mixture at a reaction temperature resulting in semiconductor nanocrystal core particles, wherein the reaction mixture further includes a ligand source comprising a phenol compound.

2. A method in accordance with claim 1 further comprising:
introducing additional amounts of one or more semiconductor nanocrystal precursors to the semiconductor nanocrystal core particles under conditions suitable to increase the size of the semiconductor nanocrystal core particles.

3. A method in accordance with claim 1 wherein the one or more semiconductor nanocrystal precursors include a semiconductor nanocrystal precursor comprising a metal-donor (M-donor), wherein the metal comprises cadmium, zinc, magnesium, mercury, aluminum, gallium, indium, thallium, lead or germanium.

4. A method in accordance with claim 1 wherein the one or more semiconductor nanocrystal precursors include a semiconductor nanocrystal precursor comprising an X donor, wherein X comprises oxygen, sulfur, selenium, tellurium, nitrogen, phosphorus, arsenic, or antimony.

5. A method in accordance with claim 1 wherein a semiconductor nanocrystal precursor comprises two or more different semiconductor nanocrystal precursors.

6. A method in accordance with claim 3 wherein the semiconductor nanocrystal precursor comprises one or more metal carboxylates.

7. A method in accordance with claim 6 wherein a metal in the one or more metal carboxylates comprises cadmium, zinc, magnesium, mercury, aluminum, gallium, indium, thallium, lead, or germanium.

8. A method in accordance with claim 3 wherein the ratio of moles of boronic compound to moles of metal in the semiconductor nanocrystal precursor in the reaction mixture is at least one.

9. A method in accordance with claim 1 wherein the reaction is carried out in the absence of $O_2$.

10. A method in accordance with claim 2 wherein the additional amounts of the one or more semiconductor nanocrystal precursors are introduced in the presence of the boronic compound.

11. A method in accordance with claim 1 wherein the semiconductor nanocrystals are made in the absence of an amine.

12. A method in accordance with claim 1 further including growing a coating over at least a portion of an outer surface of at least a portion of the semiconductor nanocrystal core particles.

13. A method in accordance with claim 12 further comprising isolating the semiconductor nanocrystal core particles from the reaction mixture prior to the overcoating step.

14. A method in accordance with claim 12 wherein the coating comprises one or more semiconductor materials.

15. A method in accordance with claim 1 further including growing a coating over at least a portion of an outer surface of at least a portion of the semiconductor nanocrystal core particles, wherein the coating is formed without the semiconductor nanocrystals being first isolated from the reaction mixture.

16. A method in accordance with claim 1 wherein the semiconductor nanocrystal core particles are isolated and then exposed to additional amounts of the one or more semiconductor nanocrystal precursors under suitable reaction conditions such that the semiconductor nanocrystal core particles grow in size.

17. A method in accordance with claim 8 wherein the boronic compound comprises a boronic acid.

18. A method in accordance with claim 12 wherein the coating is grown in the presence of a boronic compound.

19. A method for preparing semiconductor nanocrystals, the method comprising:
- heating a mixture including a non-coordinating solvent, a Group IIIA metal-donor, wherein M represents one or more metals from Group III, a boronic acid, and a ligand source comprising a phenol compound;
- adding a Group VA-donor, wherein the Group VA-donor includes one or more Group VA elements, to the mixture to form a reaction mixture, wherein the ratio of moles of Group V elements to moles of Group III metals in the reaction mixture is less than or equal to one; and
- reacting the Group IIIA-donor and the Group VA-donor in the reaction mixture to form semiconductor nanocrystal core particles comprising a III-V semiconductor.

* * * * *